(12) United States Patent
Kim

(10) Patent No.: US 7,977,871 B2
(45) Date of Patent: *Jul. 12, 2011

(54) ORGANIC ELECTROLUMINESCENT DEVICE AND METHOD FOR FABRICATING THE SAME

(75) Inventor: Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 240 days.

This patent is subject to a terminal disclaimer.

(21) Appl. No.: 11/987,753

(22) Filed: Dec. 4, 2007

(65) Prior Publication Data

US 2008/0116791 A1    May 22, 2008

(51) Int. Cl.
*H01J 1/62* (2006.01)

(52) U.S. Cl. .......... 313/505; 313/506

(58) Field of Classification Search .......... 313/503, 313/506
See application file for complete search history.

(56) References Cited

U.S. PATENT DOCUMENTS

| | | | |
|---|---|---|---|
| 6,433,487 B1 | 8/2002 | Yamazaki | |
| 6,538,374 B2 * | 3/2003 | Hosokawa | 313/504 |
| 6,555,969 B2 | 4/2003 | Yamazaki | |
| 6,670,772 B1 | 12/2003 | Arnold et al. | |
| 6,724,150 B2 | 4/2004 | Maruyama et al. | |
| 6,831,407 B2 | 12/2004 | Cok | |
| 6,870,186 B2 | 3/2005 | Park et al. | |
| 7,042,149 B2 | 5/2006 | Shigeno | |
| 7,071,617 B2 | 7/2006 | Utsumi et al. | |
| 7,554,171 B2 * | 6/2009 | Katz | 257/506 |
| 2002/0063518 A1 | 5/2002 | Okamoto et al. | |
| 2002/0135293 A1 * | 9/2002 | Aruga | 313/493 |
| 2002/0167743 A1 * | 11/2002 | Matsuo et al. | 359/891 |
| 2003/0137325 A1 * | 7/2003 | Yamazaki et al. | 327/80 |
| 2003/0151355 A1 | 8/2003 | Hosokawa | |
| 2004/0004432 A1 * | 1/2004 | Park et al. | 313/504 |
| 2004/0012328 A1 * | 1/2004 | Arnold et al. | 313/504 |
| 2004/0018386 A1 | 1/2004 | Naito et al. | |
| 2005/0077814 A1 * | 4/2005 | Koo et al. | 313/500 |
| 2005/0116620 A1 * | 6/2005 | Kobayashi | 313/503 |
| 2006/0158095 A1 * | 7/2006 | Imamura | 313/500 |
| 2008/0036366 A1 * | 2/2008 | Yaegashi | 313/504 |

FOREIGN PATENT DOCUMENTS

| | | |
|---|---|---|
| CN | 1365247 | 8/2002 |
| EP | 1 383 180 A2 | 1/2004 |
| JP | 10-172767 | 6/1998 |
| JP | 2002-311857 | 10/2002 |
| JP | 2003-43953 | 2/2003 |
| JP | 2003-123988 | 4/2003 |

OTHER PUBLICATIONS

Chinese Office Action dated Feb. 29, 2008 (and English-language translation).
European Office Action dated Feb. 22, 2008.
Japanese Office Action dated Jun. 10, 2010.

* cited by examiner

*Primary Examiner* — Peter Macchiarolo
(74) *Attorney, Agent, or Firm* — KED & Associates, LLP

(57) ABSTRACT

An organic electroluminescent device and a method for fabricating the same are disclosed. A first electrode, which is a pixel electrode, and a second electrode, which is a common electrode, are formed to have an uneven surface, thereby maximizing a luminous efficiency and a reflection efficiency. In addition, since a surface of a contact area between a counter electrode and a common electrode can be increased, the resistivity between the two electrodes can be reduced.

19 Claims, 10 Drawing Sheets

US 7,977,871 B2

ORGANIC ELECTROLUMINESCENT DEVICE AND METHOD FOR FABRICATING THE SAME

CROSS-REFERENCE TO RELATED APPLICATIONS

This application claims priority from U.S. patent application Ser. No. 10/837,710 filed May 4, 2004, which claims the benefit of Korean Application Nos. P2003-029047, filed on May 7, 2003, and P2003-040713, filed on Jun. 23, 2003, the subject matters of which are hereby incorporated by reference.

BACKGROUND OF THE INVENTION

1. Field of the Invention

The present invention relates to an electroluminescent device, and more particularly, to an active matrix electroluminescent device and a method for fabricating the same.

2. Discussion of the Related Art

An electroluminescent device is being viewed as a next generation flat display device for its characteristics of a wide viewing angle, a high aperture ratio, and a high chromaticity. More specifically, in an organic electroluminescent (EL) device, when an electric charge is injected into an organic luminescent layer formed between a hole injection electrode and an electron injection electrode, the electron and the hole are paired to each other generating an exciton, the excited state of which falls to a ground state, thereby emitting light. Thus, the organic electroluminescent device (ELD) can be operated at a lower voltage, as compared to other display devices.

Depending upon the driving method, the organic ELD can be classified into a passivation ELD and an active matrix ELD. The passivation ELD is formed of a transparent electrode on a transparent substrate, an organic EL layer on the transparent electrode, and a cathode electrode on the organic EL layer. The active matrix ELD is formed of a plurality of scan lines and data lines defining a pixel area on a substrate, a switching device electrically connecting the scan lines and the data lines and controlling the electroluminescent device, a transparent electrode electrically connected to the switching device and formed in the pixel area on the substrate, an organic EL layer on the transparent electrode, and a metal electrode on the organic EL layer. Unlike the passivation ELD, the active matrix ELD further includes the switching device, which is a thin film transistor (TFT).

However, the related art active matrix ELD is disadvantageous in that the thin film transistor causes a decrease in the aperture ratio and the luminous efficiency of the device. An expansion of the pixel area is required in order to enhance the aperture ratio and the luminous efficiency. However, there are limitations to such expansion. More specifically, an excessive expansion of the pixel area causes deficiency in the functions of the thin film transistor, the counter electrode, and the metal electrode.

SUMMARY OF THE INVENTION

Accordingly, the present invention is directed to an organic electroluminescent device and a method for fabricating the same that substantially obviate one or more problems due to limitations and disadvantages of the related art.

An object of the present invention is to provide an organic electroluminescent device and a method for fabricating the same that enhances the luminous efficiency and improves the electrical function of the device, simultaneously.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescent device includes a substrate including a thin film transistor having a pixel area defined thereon, a planarized insulating layer formed on the thin film transistor and substrate, a first electrode formed on the planarized insulating layer and having a plurality of uneven patterns, an electroluminescent layer formed on the first electrode, and a second electrode formed on the electroluminescent layer.

Herein, the planarized insulating layer has a plurality of uneven patterns on the pixel areas and a contact hole on the thin film transistor. Also, the electroluminescent layer and the second electrode have a plurality of uneven patterns on the pixel area.

The organic electroluminescent device further includes an insulating layer formed on a predetermined portion of the first electrode on a boundary area of the pixel area and having a projected part projecting into the pixel area, and a counter electrode formed on the insulating layer and having a projected part in the pixel area.

In another aspect of the present invention, a method for fabricating an organic electroluminescent device includes forming a thin film transistor on a substrate and having a pixel area defined thereon, forming a planarized insulating layer having a plurality of uneven patterns on an entire surface of the thin film transistor and substrate, forming a first electrode having a plurality of uneven patterns on the planarized insulating layer, forming an electroluminescent layer on the first electrode, and forming a second electrode on the electroluminescent layer.

Herein, the forming of a planarized insulating layer having a plurality of uneven patterns includes depositing an insulating material layer on an entire surface of the thin film transistor and substrate, forming a plurality of patterns having pillar shapes on the insulating material layer, and heat-treating the insulating material layer. In addition, the patterns having pillar shapes are formed to be spaced apart from one another to have a predetermined gap and formed to have a predetermined width.

The method for fabricating the organic electroluminescent device further includes forming an insulating layer on a predetermined portion of the first electrode at a boundary area of the pixel area and having an extended part into the pixel area, and forming a counter electrode on the insulating layer including the extended part.

In another aspect of the present invention, an organic electroluminescent device includes a substrate including a thin film transistor having a pixel area defined thereon, a first insulating layer formed on the thin film transistor and substrate, a first electrode formed on the first insulating layer, a second insulating layer formed on a predetermined portion of the first insulating layer excluding the pixel area and having a projected part at the pixel area, a counter electrode formed on the second insulating layer having a projected part at the pixel area, an electroluminescent layer formed on the first electrode at the pixel area, and a second electrode formed on the electroluminescent layer and the counter electrode.

Herein, the first insulating layer has a plurality of uneven patterns at the pixel area and a contact holes on the thin film transistor. Additionally, the electroluminescent layer and the second electrode have a plurality of uneven patterns. Also, the electroluminescent layer is formed only at the pixel area excluding the projected part of the counter electrode.

In a further aspect of the present invention, a method for fabricating an organic electroluminescent device includes forming a thin film transistor on a substrate and having a pixel area defined thereon, forming a first insulating layer on an entire surface of the thin film transistor and substrate, forming a first electrode on the first insulating layer, forming a second insulating layer on a predetermined portion of the first electrode excluding the pixel area and including a projected part in the pixel area, forming a counter electrode having a projected part in the pixel area on the second insulating layer, forming an electroluminescent layer on the first electrode, and forming a second electrode on the electroluminescent layer.

Herein, the first electrode, the electroluminescent layer, and the second electrode have a plurality of uneven patterns.

In the method for fabricating the organic electroluminescent device according to the present invention, a shadow mask having a plurality of patterns formed in the same shape as the projected part of the second insulating layer is used to form the electroluminescent layer. Herein, the electroluminescent layer is formed only on the pixel area excluding the projected part of the counter electrode.

Finally, the method for fabricating the organic electroluminescent device according to the present invention further includes forming a plurality of uneven patterns and a contact hole on the first insulating layer. Herein, a plurality of patterns having pillar shapes are formed and heat-treated on the first insulating layer for forming a plurality of uneven patterns on the first insulating layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 1A to 1I illustrate cross-sectional views showing the process steps of a method for fabricating an organic electroluminescent device according to the present invention.

Figure 1A:
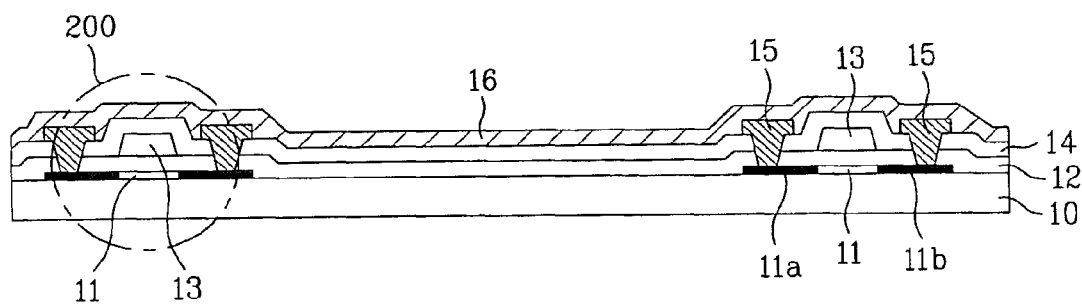
FIGS. 1A to 1I illustrate cross-sectional views showing the process steps of a method for fabricating an organic electroluminescent device according to the present invention.

Referring to FIG. 1A, in order to use the glass substrate 10 as an active layer of a thin film transistor 200, a semiconductor layer is deposited by using a polycrystalline silicon. Then, the semiconductor layer is patterned, so as to leave an area whereby the thin film transistor 200 is to be formed in a later process. Subsequently, a gate insulating layer 12 is deposited on the entire surface of the substrate 10 and the patterned semiconductor layer 11, 11a, and 11b, and a conductive layer is deposited thereon, so as to form a gate electrode. The conductive layer is patterned so that only a predetermined area on the patterned semiconductor layer 11, 11a, and 11b remains, thereby forming the gate electrode 13.

Thereafter, the gate electrode 13 is used as a mask to inject impurities, such as boron (B) or phosphor (P), into the semiconductor layer 11a and 11b. Then, after a heat-treating process, source and drain areas 11a and 11b are formed on the thin film transistor 200. In addition, the area of the semiconductor layer having no impurities injected therein becomes a channel area 11. Herein, since the gate electrode 13 is used as a mask to inject impurities, the boundaries of the source and drain areas 11a and 11b and the channel area 11 are aligned with each edge of the gate electrode 13.

A first interlayer dielectric 14 is formed on the insulating layer 12 and the gate electrode 13. The first interlayer dielectric 14 and the gate insulating layer 12 are selectively etched to expose a predetermined portion of the upper surface of the source and drain area 11a and 11b, so as to form a contact hole. Then, the contact hole is filled with metal, thereby forming a plurality of electrode lines 15 each electrically connected to the source and drain area 11a and 11b. Subsequently, a second interlayer dielectric 16 is formed on the first interlayer dielectric 14 and the electrode lines 15. Herein, the forming of the second interlayer dielectric 16 can be omitted.

Figure 1B:
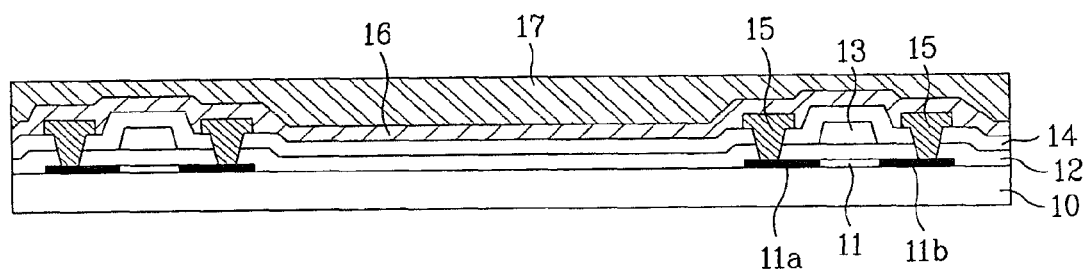

Referring to FIG. 1B, in order to form a planarized insulating layer 17 on the second interlayer dielectric 16, an insulating material is deposited on the second interlayer dielectric 16 through a spin-coating method, which is then hardened by a pre-baking process.

Figure 1C:
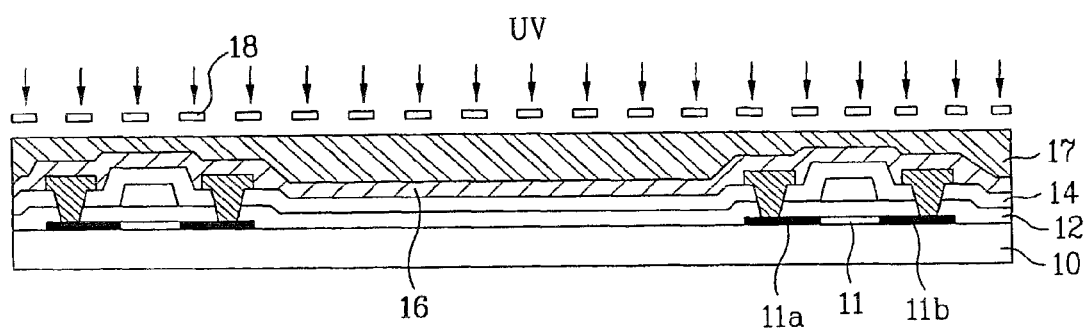
Figure 1D:
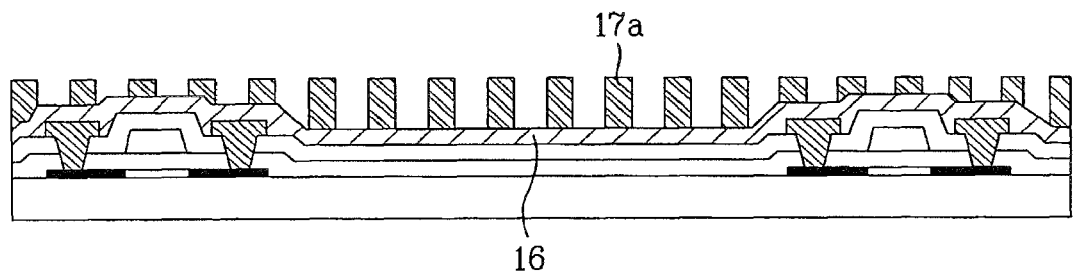

Subsequently, as shown in FIG. 1C, by using a mask 18 having a set of patterns spaced apart from one another, the planarized insulating layer 17 is exposed to UV light rays. And, by using a developing solution, the planarized insulating layer 17 is developed, so as to form a set of patterns 17a spaced apart from one another, as shown in FIG. 1D. In areas having no patterns 17a, the surface of the second interlayer dielectric 16 is exposed.

Figure 2:
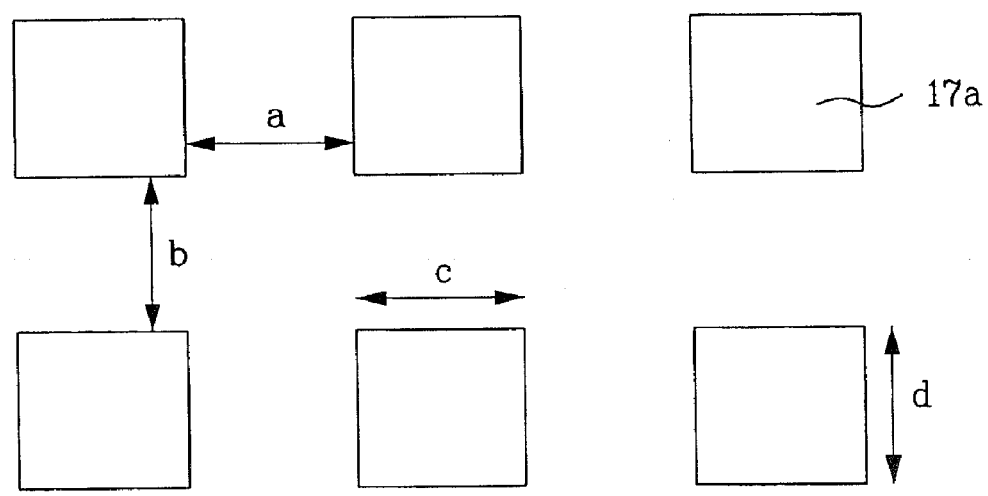
FIG. 2 illustrates a plane view showing the size of and distance between each contact hole formed on a planarized layer according to the present invention.
Figure 3:
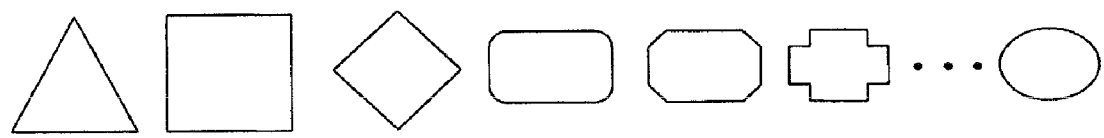
FIG. 3 illustrates a plane view of the contact holes according to another embodiment of the present invention.

FIG. 2 illustrates a plane view of the patterns according to an embodiment of the present invention. Referring to FIG. 2, the patterns 17a of the planarized insulating layer 17 are formed in the shape of square pillars. The patterns 17a can also be formed in other shapes, as shown in FIG. 3. The shapes can range from pillars having polygonal shapes of more than three end-points, oval shapes, round shapes, and so on. The patterns 17a are formed to be spaced apart at a set distance, the width and gap of which are less than 1 centimeter (cm) (i.e., $0 \leq a \leq 1$ cm, $0 \leq b \leq 1$ cm, $0 \leq c \leq 1$ cm, $0 \leq d \leq 1$ cm).

Figure 1E:
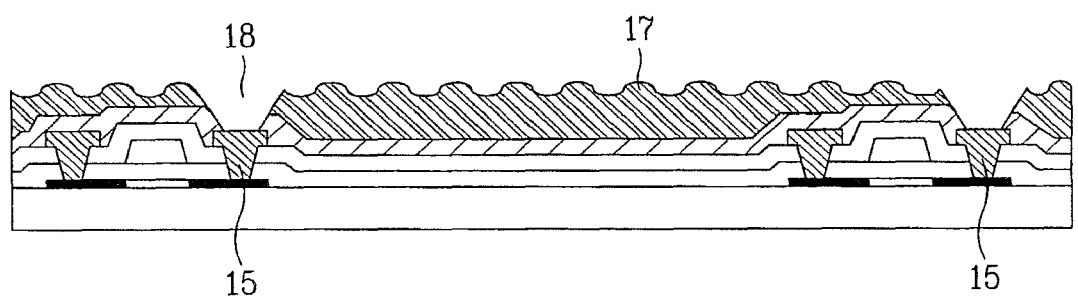

Referring to FIG. 1E, patterns having uneven shapes are formed on the surface of the planarized insulating layer 17 through a melt-baking process. At this point, when the baking process is carried out at a low temperature, which prevents the planarized insulating layer 17 from hardening, the patterns 17a melt and leak, thereby being deformed as patterns with uneven shapes. Subsequently, the planarized insulating layer 17 and the second interlayer dielectric 16 are selectively etched to expose the electrode line 15 connected to the drain area 11b of the thin film transistor 200, thereby forming a plurality of contact holes 18.

Figure 1F:
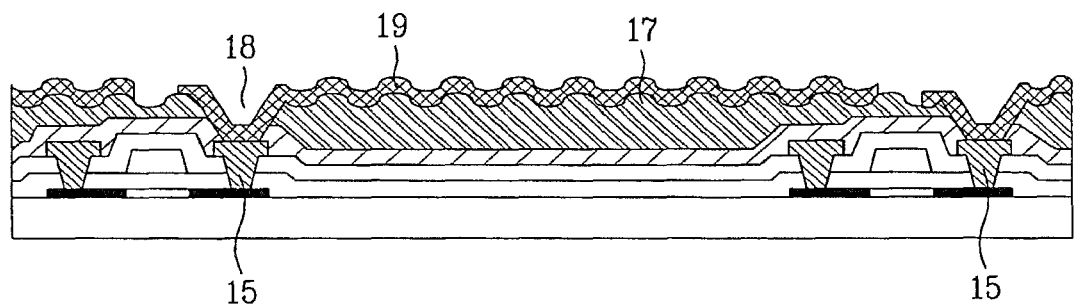

Thereafter, as shown in FIG. 1F, a first electrode 19 is formed on the entire surface of the contact holes 18 and the planarized interlayer dielectric 17. In a bottom-emission EL device, the first electrode 19 is formed of a transparent substance, such as ITO. Conversely, in a top-emission EL device, the first electrode 19 is formed of a metal with high reflexibility and high work function, such as chrome (Cr), copper (Cu), tungsten (W), gold (Au), nickel (Ni), silver (Ag), titanium (Ti), tantalum (Ta), or an alloy of any of the same. The metals can also be deposited in multi-layered forms. The first electrode 19 deposited on the inner surface of the contact hole 18 is connected to the electrode line 15 at the lower portion of the contact hole 18. The first electrode 19 deposited on the planarized insulating layer 17 has uneven shaped patterns similar to those of the planarized insulating layer 17. As described above, due to the uneven surface of the first electrode 19 at the pixel area, the reflection efficiency can be enhanced.

Moreover, the first electrode 19 is selectively removed, so as to electrically divide the pixel areas, and the first electrode becomes a plurality of pixel electrodes 19 (i.e., anodes) being electrically connected to the drain area 11b through the electrode line 15.

Figure 1G:
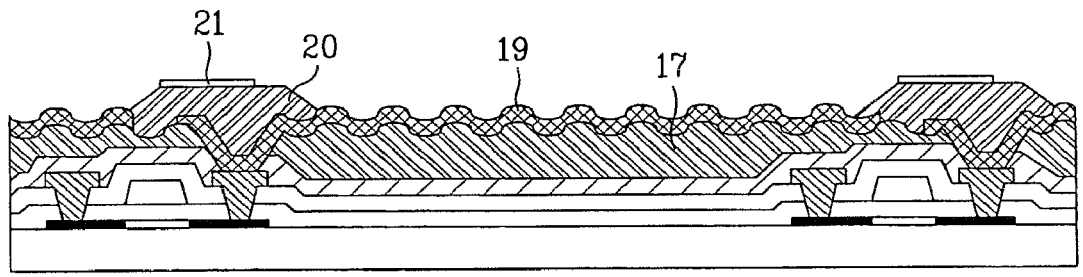

Referring to FIG. 1G, an insulating layer 20 is formed on the area excluding the pixel areas. The insulating layer 20 embeds the planarized insulating layer 17 and the pixel electrodes 19 located at the boundary area in between the pixel areas.

Figure 4:
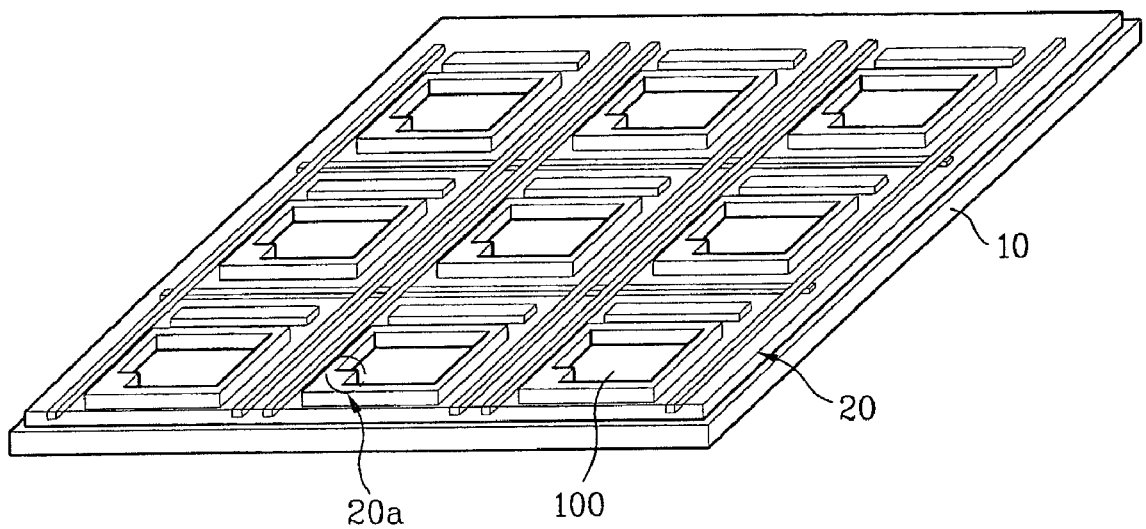
FIGS. 4 to 7 illustrate the method for fabricating the organic electroluminescent device according to the present invention.
Figure 5:
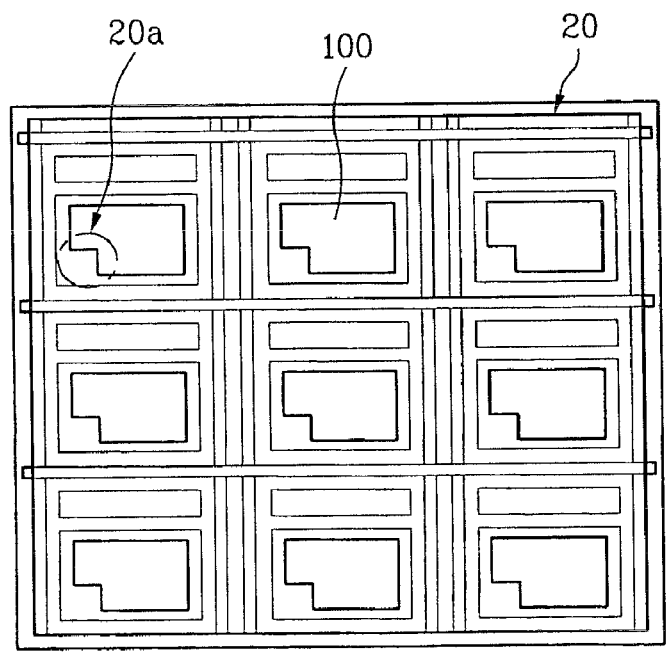

As described above, the insulating layer 20 overlaps a portion of the pixel electrode. Herein, as the area of the insulating layer 20 overlapping the pixel electrode 19 becomes larger, the pixel areas become smaller. Therefore, in order to increase the aperture ratio of the device, the overlapping area should be minimized during the fabrication process. However, when the overlapping area is excessively narrow, the contacting area between a counter electrode 21 and a second electrode 23 also becomes narrow, thereby increasing the risk of a short circuit. In order to resolve such problems, the insulating layer 20 according to the present invention has a projected part 20a projecting into a pixel area 100, as shown in FIGS. 4 and 5, so as to increase the aperture ratio and expand the contact area between the counter electrode 21 and the second electrode 23. Herein, the projected part 20a can be formed over the thin film transistor 200, or the projected part 20a can be formed in the pixel areas 100. The insulating layer 20 is extended not only to the upper portion of the boundary area between the pixel areas 100, but also to a portion of the pixel areas 100, thereby expanding the contact area between the counter electrode 21 and the second electrode 23.

Figure 6:
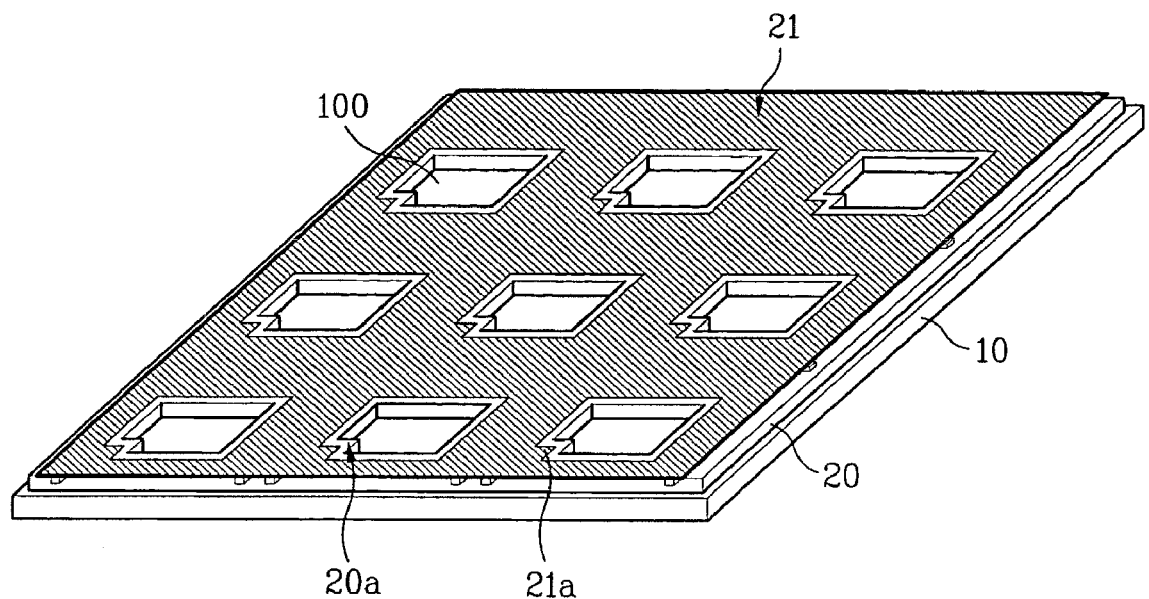
Figure 7:
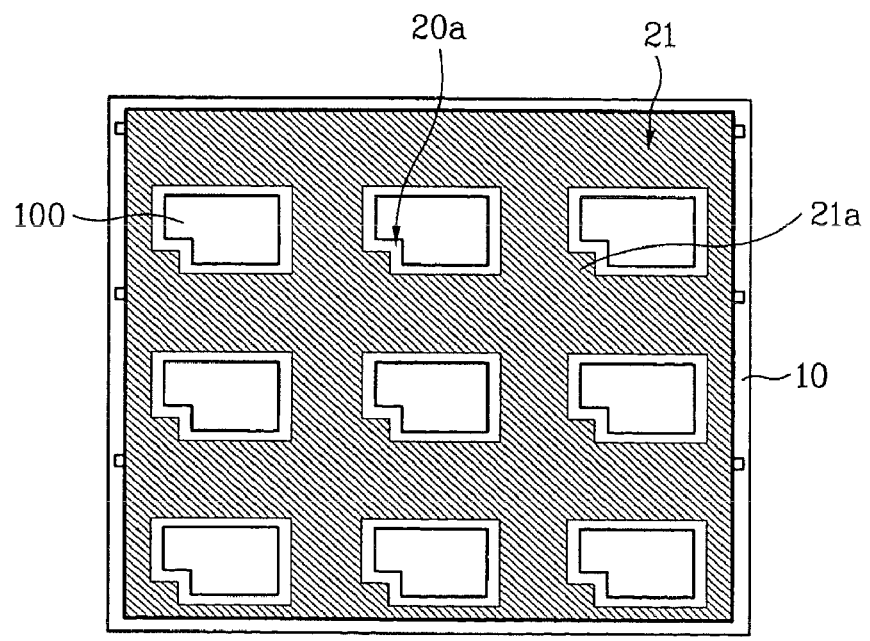

Additionally, as shown in FIGS. 6 and 7, the counter electrode 21 is formed on the insulating layer 20. The counter electrode 21 is formed on the boundary area between the pixel areas 100, just as the insulating layer 20. On the other hand, the counter electrode 21 may also be formed on the projected part 20a of the insulating layer 20. Accordingly, a high aperture ratio of the device can be maintained and the surface area of the counter electrode 21 can be expanded, simultaneously. In order to prevent the contact between the counter electrode 21 and the pixel electrodes 19, the counter electrode 21 should be formed on a predetermined portion of the insulating layer 20, so as to expose the insulating layer 20 on the periphery of each pixel areas, and not on the entire surface of the insulating layer 20. The counter electrode 21 is formed of a metal having low resistivity, such as any one of chrome (Cr), aluminum (Al), copper (Cu), tungsten (W), gold (Au), nickel (Ni), silver (Ag), and neodymium (Nd), or the alloy of any of the same. More specifically, when using a metal low in transparency, such as chrome (Cr), as the counter electrode 21, the metal can also act as a black matrix blocking light.

Figure 1H:
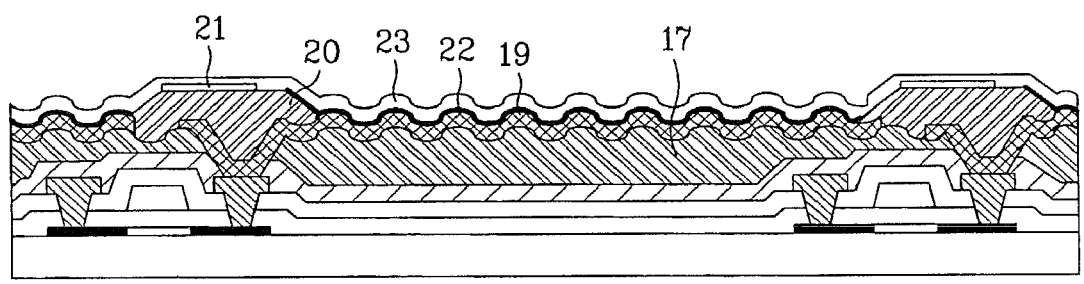
Figure 8:
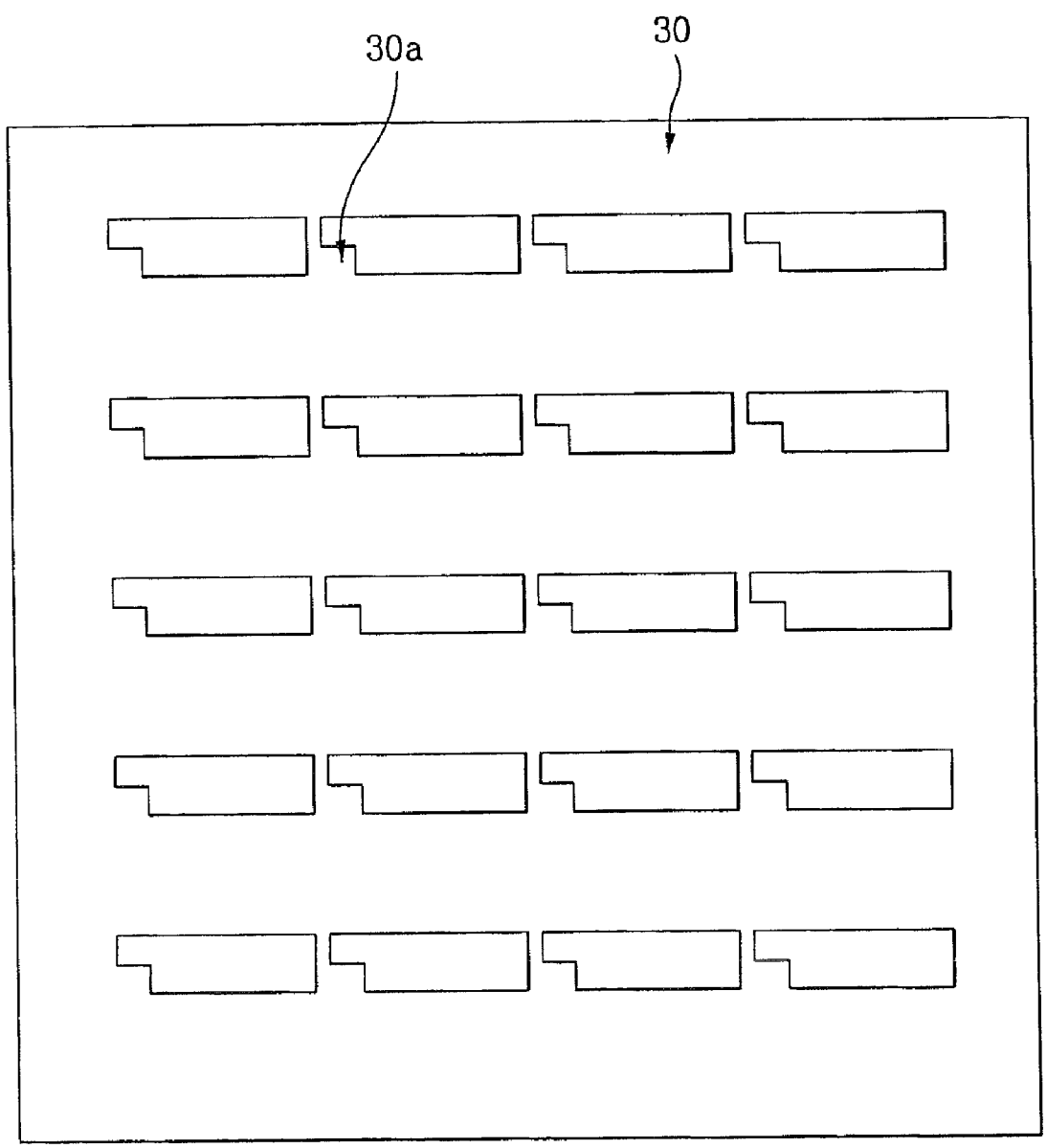
FIG. 8 illustrates a shadow mask according to the present invention.
Figure 11:
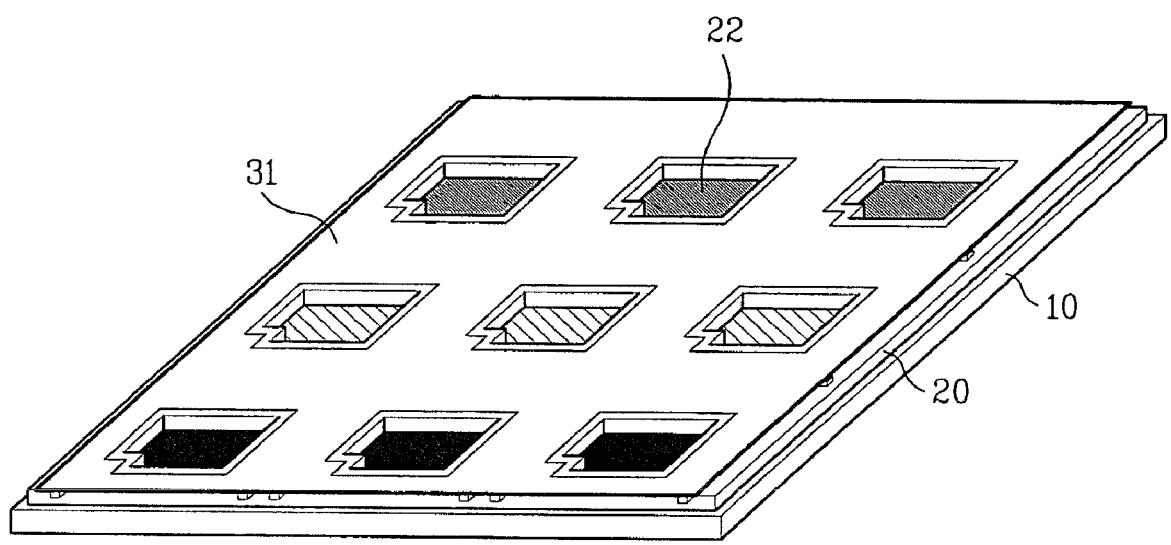

Referring to FIGS. 1H and 11, an organic electroluminent (EL) layer 22 is formed on the pixel electrodes 19 by using a shadow mask 30. The organic EL layer 22 is deposited only on the pixel areas 100. The organic EL layer 22 is formed of a hole transport layer (not shown), a emission layer (not shown), and an electron transport layer (not shown) serially deposited onto one another. In order to prevent the organic EL layer 22 from being deposited on the projected part 21a of the counter electrode 21, a plurality of patterns of the shadow mask 30 each has a projected part 30a similar to the projected part 20a of the insulating layer 20, as shown in FIG. 8.

Figure 9:
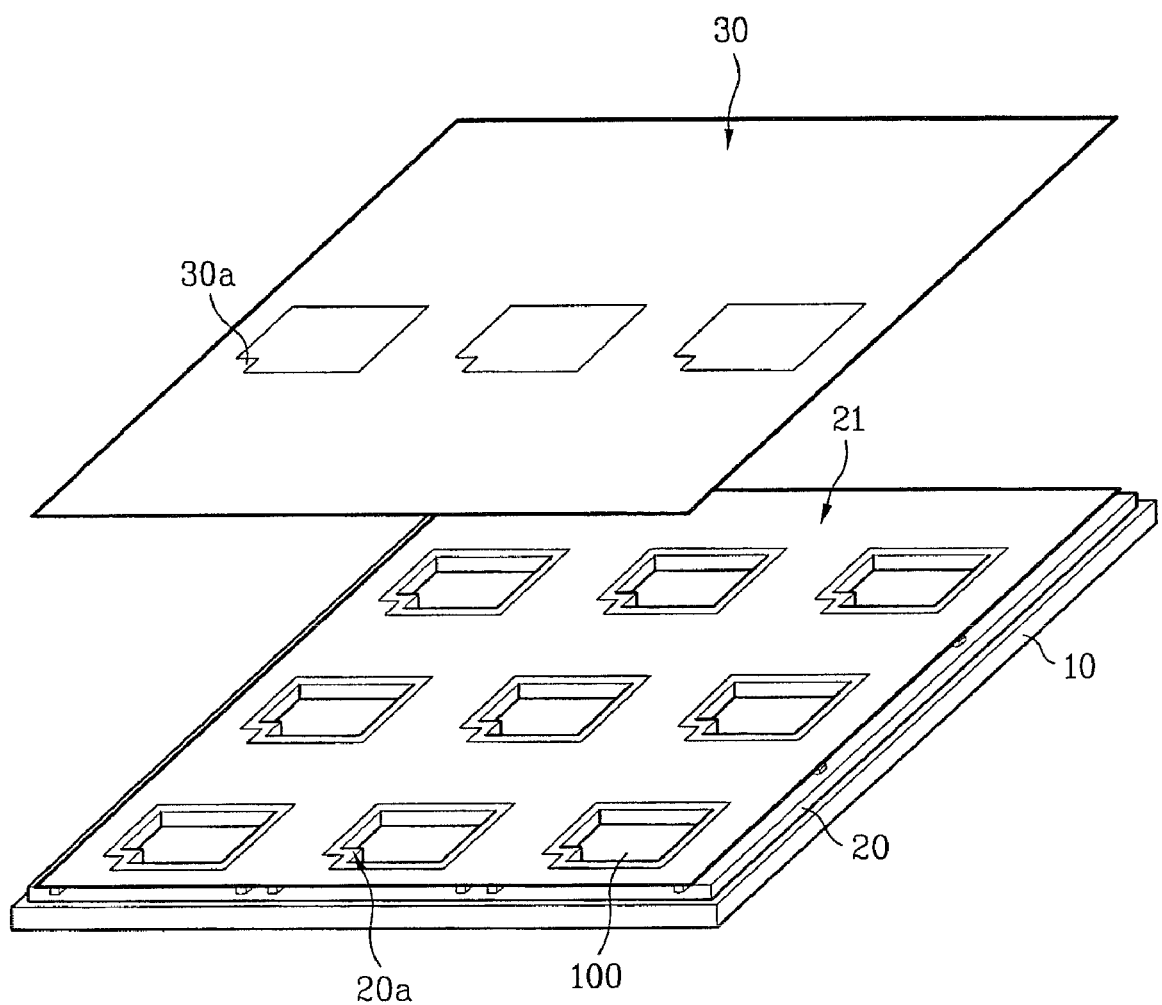
FIGS. 9 to 11 illustrate the method for fabricating the organic electroluminescent device according to the present invention.
Figure 10:
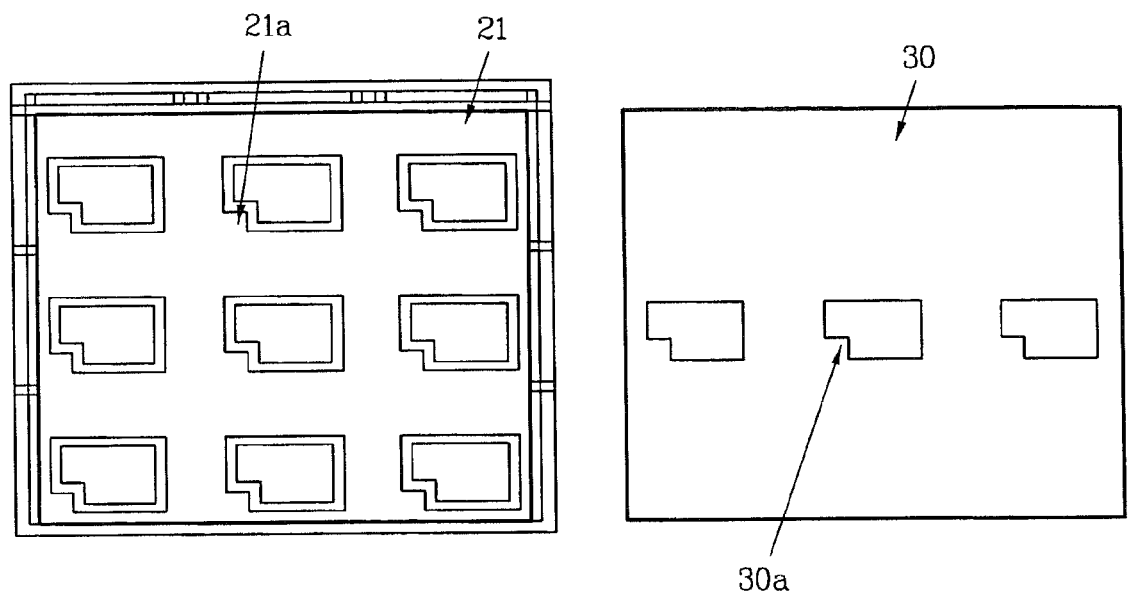

FIGS. 9 and 10 illustrate the shadow mask 30 according to other embodiments of the present invention. Referring to FIG. 9, when depositing the organic EL layer 22, the patterns of the shadow mask 30 should be aligned with the pixel areas 100. And, the projected parts 30a of the patterns should be aligned with the projected part 20a of the insulating layer 20. The organic EL layer 22 is formed in the order of the colors red (R), green (G), and blue (B). By using the shadow mask 30, a red emission material, a green emission material, and a blue emission material are serially deposited. The shadow mask 30 is also used when depositing a common material of each of the R, G, and B organic EL layers 22.

As shown in FIG. 1H, the second electrode 23 is deposited on the exposed portion of the insulating layer 20, the counter electrode 21, and the organic EL layer 22. In the top-emission EL device, the second electrode 23 is formed of a transparent conductive material, such as indium tin oxide (ITO) or indium zinc oxide (IZO). On the other hand, in the bottom-emission EL device, the second electrode 23 is formed of a metal having high reflectivity. In the top-emission EL device, in order to form the second electrode 23, an aluminum layer having a thickness of several nanometers (nm) and either a silver layer having a thickness in the range of several to several tens of nanometers (nm), or a metal of a $Mg_xAg_{x-1}$ group having a thickness in the range of several to several tens of nanometers (nm), are serially deposited on the entire surface of the exposed portion of the insulating layer 20 and the organic EL layer 22.

Figure 1I:
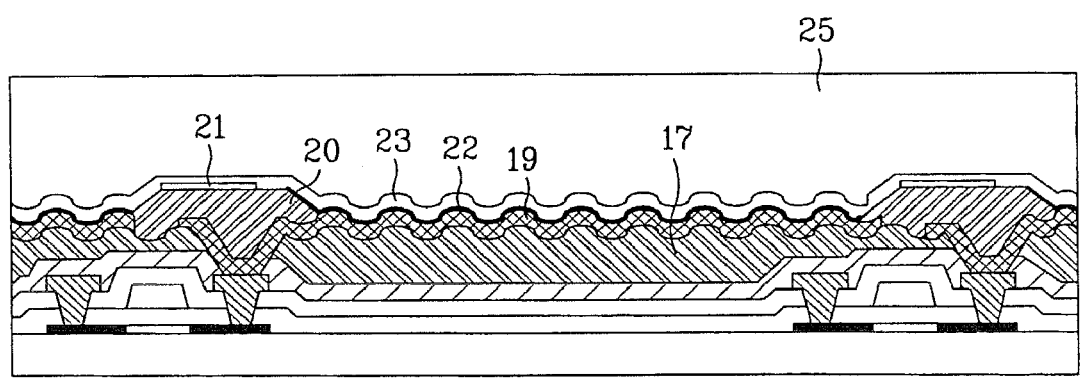

Finally, referring to FIG. 1I, a protective layer 25 is formed to protect the organic EL layer 22 from oxygen or moisture. Subsequently, although not shown in the drawings, a protective cap is mounted thereon by using a sealant and a transparent substrate, thereby completing the active matrix organic electroluminescent device according to the present invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescent device comprising:
a substrate having a plurality of thin film transistors;
a first insulating layer having an uneven pattern formed on the substrate;
a first electrode formed on a first predetermined portion of the first insulating layer;
a second insulating layer formed on a second predetermined portion of the first insulating layer;
a counter electrode that overlaps the second insulating layer;
an electroluminescent layer formed on the first electrode; and
a second electrode formed on the electroluminescent layer,
wherein the counter electrode partially overlaps a semiconductor layer of one of the thin film transistors, the first electrode is coupled to an electrode of the corresponding thin film transistor through a contact hole formed in the first insulating layer having the uneven pattern, and the uneven pattern of the first insulating layer has a curved shape,
wherein a first coupling area between the first electrode and the electrode of the thin film transistor overlaps a second coupling area between the semiconductor layer and the electrode of the thin film transistor.

2. The device of claim 1, wherein the uneven pattern comprises a plurality of patterns spaced apart from one another by a gap of less than 1 cm.

3. The device of claim 1, wherein the uneven pattern comprises a plurality of patterns having a width of less than 1 cm.

4. The device of claim 1, wherein the uneven pattern comprises a plurality of round shapes at a thickness direction.

5. The device of claim 1, wherein at least one of the second insulating layer and the counter electrode includes a projected part to project into a pixel area.

6. The device of claim 1, wherein the first electrode comprises a transparent substance.

7. The device of claim 1, wherein the first electrode comprises a metal.

8. The device of claim 1, wherein the first electrode comprises an anode.

9. The device of claim 1, wherein the second electrode comprises a transparent conductive material.

10. The device of claim 1, wherein the second electrode comprises a metal.

11. The device of claim 1, wherein the first electrode, the electroluminescent layer and the second electrode have the uneven pattern.

12. An organic electroluminescent device comprising:
a substrate having a plurality of thin film transistors;
a first electrode formed on the substrate;
a first insulating layer formed on a predetermined portion of the substrate and having an uneven pattern;
a counter electrode that overlaps the first insulating layer;
an electroluminescent layer formed on the first electrode; and
a second electrode formed on the electroluminescent layer,
wherein the counter electrode partially overlaps a semiconductor layer of one of the thin film transistors, the first electrode is coupled to an electrode of the corresponding thin film transistor through a contact hole formed in the first insulating layer having the uneven pattern, and the uneven pattern of the first insulating layer has a curved shape,
wherein a first coupling area between the first electrode and the electrode of the thin film transistor overlaps a second coupling area between the semiconductor layer and the electrode of the thin film transistor.

13. The device of claim 12, wherein the uneven pattern comprises a plurality of patterns spaced apart from one another by a gap of less than 1 cm.

14. The device of claim 12, wherein the uneven pattern comprises a plurality of patterns having a width of less than 1 cm.

15. The device of claim 12, wherein the uneven pattern comprises a plurality of round shapes at a thickness direction.

16. The device of claim 12, further comprising a second insulating layer formed on a portion of the first insulating layer.

17. The device of claim 16, wherein the counter electrode further overlaps the second insulating layer.

18. The device of claim 16, wherein at least one of the second insulating layer and the counter electrode includes a projected part to project into a pixel area.

19. The device of claim 12, wherein the first electrode, the electroluminescent layer and the second electrode have the uneven pattern.

* * * * *

UNITED STATES PATENT AND TRADEMARK OFFICE
CERTIFICATE OF CORRECTION

PATENT NO. : 7,977,871 B2  
APPLICATION NO. : 11/987753  
DATED : July 12, 2011  
INVENTOR(S) : Chang Nam Kim Page 1 of 1

It is certified that error appears in the above-identified patent and that said Letters Patent is hereby corrected as shown below:

On the Title Page insert

Item

--Related U.S. Application Data
(62)    Continuation of application No. 10/837,710, filed on May 4, 2004, now Pat. No. 7,312,571--

Item

--(30)        Foreign Application Priority Data
May 7, 2003     (KR)    10-2003-0029047
June 23, 2003   (KR)    10-2003-0040713--

Signed and Sealed this
Eighteenth Day of October, 2011

David J. Kappos
*Director of the United States Patent and Trademark Office*